(12) United States Patent
Hernandez et al.

(10) Patent No.: US 6,987,392 B1
(45) Date of Patent: Jan. 17, 2006

(54) ELECTROMAGNETIC PROTECTION TEST AND SURVEILLANCE SYSTEM

(75) Inventors: Arecio A. Hernandez, Melbourne, FL (US); David George Hoyt, Satellite Beach, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/839,835

(22) Filed: May 5, 2004

(51) Int. Cl.
*G01R 27/28* (2006.01)

(52) U.S. Cl. .................................... 324/627; 324/632

(58) Field of Classification Search ............. 174/35 R; 324/95, 612, 627, 632; 342/174
See application file for complete search history.

(56) References Cited

U.S. PATENT DOCUMENTS 4,962,358 A * 10/1990 Svetanoff ................ 324/627

6,870,090 B2 * 3/2005 Agrawal et al. ........ 174/35 R

* cited by examiner

*Primary Examiner*—Walter Benson
(74) *Attorney, Agent, or Firm*—Allen, Dyer, Doppelt, Milbrath & Gilchrist, P.A.

(57) ABSTRACT

A test architecture performs calibration and site verification testing of the effectiveness of a radiation shielding structure within which electronic equipment is housed. An external subsystem is outside a shielding cabinet, and an internal subsystem resides with the electronic equipment within the shielded equipment housing proper. The external subsystem includes a host computer, which controls the operation of transmit and receive subsystems. An external receiver is selectively coupled by the host processor to either an RF receive antenna or to a current sense probe. All control signals from the external subsystem are conveyed into the shielded cabinet by way of fiber optic links, in order to preserve the shielding effectiveness of the cabinet. Having the source of test signals and its associated transmission antenna located within the shielded cabinet serves to minimize the impact of such signals on circuits within the environment outside the cabinet.

19 Claims, 6 Drawing Sheets

ELECTROMAGNETIC PROTECTION TEST AND SURVEILLANCE SYSTEM

The present invention was made with Government support under Prime Contract No. HQ0006-01-C-0001 awarded by the Department of Defense. The Government has certain rights in this invention.

FIELD OF THE INVENTION

The present invention relates in general to communication systems and subsystems therefor, and is particularly directed to a new and improved architecture and methodology for performing calibration and installation site verification testing of the effectiveness of an electromagnetic radiation shielding structure within which electronic equipment is installed.

BACKGROUND OF THE INVENTION

In order to protect the circuit components of electronic equipment from potentially damaging electromagnetic radiation, such as an externally-sourced electromagnetic pulse (EMP) or other interference signals such as radar, broadcast radio and TV, Cellular Phone, etc., it is customary practice to house the equipment within some form of shielded structure such as a cabinet, or enclosure as non-limiting examples. An adjunct to this shielding structure is the need to verify its shielding effectiveness, once the equipment has been deployed at a host facility. Up to the present, it has been conventional practice to conduct only 'acceptance' testing of the shielding for densely populated enclosures within a laboratory environment at the factory, and then assume that once it has passed the acceptance test, the shielding structure's effectiveness will be sustained in the equipment's deployed environment.

However, there is a government agency 'verification' requirement (MIL-STD-188-125) that mandates the ability to test the shielding effectiveness of the protective structure subsequent to deployment of the equipment at a host facility, such testing can be very difficult or impossible due to the lack of room inside a densely populated shielded structure. This strict verification requirement creates a two-fold problem that is typically encountered when attempting to conduct on-site testing of the electromagnetic radiation shielding-effectiveness of the protective enclosure.

A first is the fact that there is usually very little, if any, room inside the equipment cabinet proper to install testing hardware and its associated antenna, particularly once the cabinet has been integrated with other units at a host site, such as a commercial communication facility. Secondly, it is necessary that signals emitted by the testing apparatus not interfere with the operation of other electronic circuitry that may be located within the same environment as the electronic circuitry under test. Indeed, commercial telecommunication providers customarily refuse to allow the use of RF radiating test equipment in their facilities for fear that the testing might interrupt service.

SUMMARY OF THE INVENTION

In accordance with the present invention, these and other problems are successfully addressed by a new and improved testing architecture and methodology that is operative to perform calibration prior to installation in the field and thereafter perform installation site monitoring and verification testing of the effectiveness of an electromagnetic radiation shielding structure within which electronic equipment is installed.

For this purpose, the architecture of the present invention includes an external subsystem, which is located outside an Electromagnetic shielded enclosure containing electronic equipment to be protected, and an internal subsystem, that is configured to be readily installed along with the electronic equipment within the shielded equipment housing proper. The external subsystem includes a host computer, which controls the operation of each of the transmit and receive subsystems, and a receiver, which is selectively coupled by the host processor to either an RF receive antenna or to a current sense probe. The receive antenna, which may be implemented as a log periodic antenna, that may be pivotally mounted by way of a boom to the cabinet, so that its boresight may be selectively directed at the center of a cabinet door-mounted, ferrite-loaded log-spiral RF transmission antenna for either of first and second spatial locations of the antenna (respectively associated with the open or closed state of a cabinet door). Configuring the RF transmission antenna as a low profile, ferrite-loaded, (log)-spiral shape facilitates its being unobtrusively supported on the inside of a cabinet door, so as to facilitate space saving, and also enable it to be located directly adjacent to the electromagnetic shielding structure of the cabinet. This serves to minimize physical interference with other user equipment, and provides an efficient radiator with constant load impedance over a wide frequency range that is substantially unaffected by conductive surfaces (the door shielding) in close proximity. The current sense probe is coupled to a power interface, through which primary power is supplied from an external power supply to the circuitry components housed within the shielding enclosure.

All control signals transmitted between external and internal subsystems are routed into the shielded cabinet by way of fiber optic links, in order to eliminate RF leakage from the shielded enclosure, and thereby prevent RF emissions that might interfere with other systems in an equipment bay commonly shared with the protected equipment. A prescribed reference signal (e.g., a 10 MHz clock internal to the receiver) is used to synchronize and lock respective receive and transmit oscillators within the receiver and signal generator, so that the two exactly track each other during scanning of test frequencies. The signal generator is operative under processor control to generate all test signals that are employed to test the effectiveness of the electromagnetic shielding of the cabinet, including the RF attenuation of a power filter that is coupled with the power source for the cabinet. Having the source of test signals and its associated transmission antenna located within the shielded cabinet serves to minimize the impact of such signals on circuits within the environment outside the cabinet.

The receive antenna is preferably mounted by way of a pivotable attachment at the distal end of a boom, which is supported by and extends outwardly from the top of the shielding enclosure. This allows the receive antenna to readily clear a cabinet door through which physical access to the interior of the cabinet is provided. In addition, the pivotable attachment of the antenna to the distal end of the boom allows the antenna to be oriented at a selected boresight projection angle relative to the plane of the log-spiral transmission antenna for either the open or closed state of the door. A 45° degree orientation of the receive antenna allows it to capture both horizontal and vertical polarization components of the RF emissions from RF transmission antenna for either of a first spatial location of antenna corresponding to the open state of the cabinet door (calibration mode), or a second spatial location of the transmission antenna corresponding to the closed state of the cabinet door (verification mode). To compensate for the effect of the ground plane imparted by the metallic material of the door, the printed circuit board upon which the spiral pattern of the transmission antenna is preferably back-loaded with ferrite material. This results in a relatively low standing wave ratio across the entirety of its operational frequency band.

The electromagnetic protection test and surveillance system of the present invention has two operational modes—calibration and verification. The calibration mode is conducted with the cabinet door(s) open prior to installing the shielded cabinet in the field; the shielding verification mode is conducted with the cabinet door(s) closed after the cabinet has been deployed and is integrated with other equipment in an electronic equipment bay.

When the system is operated in calibration mode, the cabinet door is open, and the receive antenna is oriented so that its boresight is pointed at the center of the log-spiral door-mounted transmit antenna. The RF signal switches are controlled so that the output of the signal generator will be supplied to the transmit antenna, and so that the output of the receive antenna will be coupled to the external receiver. The controller then tunes the receiver and the transmit signal generator to a first test frequency of a prescribed band of frequencies, and instructs the signal generator to transmit at that frequency at a prescribed power level. The energy level received by the receiver is then stored in memory as the open door calibration value. The control processor then subtracts from that stored value a predetermined shielding performance threshold (e.g., 80 dB), plus a signal-to-noise (e.g., 14 dB) buffer value to establish a maximum allowable noise floor that will permit reliable and repeatable measurements, and stores this maximum noise floor value. This series of operations is then repeated for all of the remaining frequencies into which the band of interest has been divided. As a non-limiting example, the band being tested (e.g., 200 Mhz–1 GHz) may be subdivided into respective log-based frequency intervals, at each of which the calibration measurement process described above is carried out.

Once the control processor has conducted the above routine for the last RF frequency in the RF calibration band, it proceeds to calibrate the effectiveness of the power filter. Alternatively, the control processor may calibrate the effectiveness of the power filter, prior to conducting the calibration routine, without a loss in generality. With the cabinet door(s) closed, the control processor sets the positions of signal routing switches so that the transmit/receive path proceeds from the signal generator—current coupler—the power filter—current probe—receiver.

The signal generator and the receiver are then tuned to the same frequency (e.g., 10 KHz) and the attenuation performance of the power filter is measured. The resulting attenuation value is stored to provide a baseline against which to measure the attenuation performance of the power filter once the equipment has been installed in the field. In addition, an offset (e.g., 6 dB lower than the measured value) may be stored as an alarm threshold for use in the field. Namely, once the equipment has been installed, if the attenuation Characteristics of the filter at the performance measurement frequency (10 KHz) are less than the offset (6 dB), the control processor may issue a 'filter failure' indication.

When the calibration routines have been completed, the cabinet is ready for deployment in the field. Once deployed, a cabinet shielding performance verification test is conducted. A precursor aspect of the shielding performance test is to look for the presence of ambient noise (RF interference) sources that might be coincident with one or more of the frequencies of interest. Whenever an ambient noise sources is found, the controller locates and identifies a nearby (slightly higher) frequency that is effectively free of ambient interference. At each frequency iteration for which it has been determined that a prescribed maximum noise floor is not exceeded, the transmitter generates that frequency and a shielding measurement is performed.

To this end, with the cabinet door closed, the receive antenna is pivoted from its position used in the calibration routine, described above, so that it points at the center of the transmit antenna. Next, the control processor tunes the receiver to the first test frequency of the prescribed band of frequencies of interest, and measures power level received by the receiver. This power measurement is then compared with the maximum allowable noise floor value, previously stored during the calibration routine. If the output of the receiver is at or below the maximum allowable noise floor value for the frequency of interest, it is inferred that there is not a significant source of ambient interference at this frequency.

The signal generator generates an output at the same power level used during the calibration routine at the frequency of interest, and the output of the receiver is measured at this frequency. The output of the receiver is then compared with the previously stored open door calibration value. The shielding effectiveness is calculated by subtracting the closed door received power level from the stored open door calibration value. If the shielding effectiveness is above the predetermined performance threshold (i.e., 80 dB), the effectiveness of the shielding for that frequency is denoted as a PASS. On the other hand, if the calculated shielding effectiveness is below the predetermined performance threshold, the effectiveness of the shielding for that frequency is denoted as a FAIL. This process is then iteratively repeated for each of the frequencies for which a calibration test was performed.

If, during the verification test, the output of the receiver is not below the maximum allowable noise floor value for the frequency of interest, it is inferred that there is a source of ambient interference at that frequency. In response, the band interval between the current frequency, to which the transmitter and receiver are presently tuned, and the next higher frequency of the frequency band of interest, is subdivided into sub-band containing a prescribed plurality (e.g., 100) of frequencies between these two frequencies.

Next, the controller tunes the receiver to the first frequency in the sub-band and measures ambient energy received by the receiver. This energy measurement is then compared with the maximum allowable noise floor. If the output of the receiver is not below the noise floor value for the sub-band of interest, it is inferred that there is a source of ambient interference at this frequency, so that a shielding effectiveness measurement is not to be carried out at this frequency. Instead, the routine increments the receiver to the next frequency in the sub-band and measures the ambient energy received by the receiver, as described above.

Where the output of the receiver is below the noise floor value for the sub-band frequency of interest, it is inferred that there is not a significant source of ambient interference at this frequency, so that a shielding effectiveness measurement may be carried out at this frequency. In this case, the signal generator is caused to generate an output at the sub-band frequency of interest, and the output of the receiver is measured at this frequency. The output of the receiver is then compared with the previously stored open door calibration value. The shielding effectiveness is calculated by subtracting the closed door received power level from the stored open door calibration value. If the shielding effectiveness is above the predetermined performance threshold (i.e., 80 dB), the effectiveness of the shielding for that frequency is denoted as a PASS. Otherwise, the effectiveness of the cabinet shielding for this sub-band frequency is denoted as a FAIL. The routine then increments the tuning of the receiver and signal generator to the next frequency subdivision of the band of interest, and repeats the measurement process at that frequency.

Once the control processor has conducted the RF shielding verification test routine for the last RF frequency (e.g., 1 GHz) in the RF calibration band, it may proceed to measure the effectiveness of the power filter. Alternatively, as was the case with the calibration test, the power filter test may be conducted prior to the shielding verification test. The steps of the power filter verification test are essentially the same as the calibration test conducted in the lab. The resulting attenuation value is compared with that previously stored during the calibration test. If the attenuation is at least as high as the calibration value, it is inferred that the filter is operating properly, and a PASS output is generated. On the other hand, if the attenuation is not as high as the calibration value, its difference is noted. As a further safeguard, if the attenuation is less than the previously stored alarm threshold offset, an alarm may be issued as a 'filter failure' indication.

DETAILED DESCRIPTION

Figure 1:
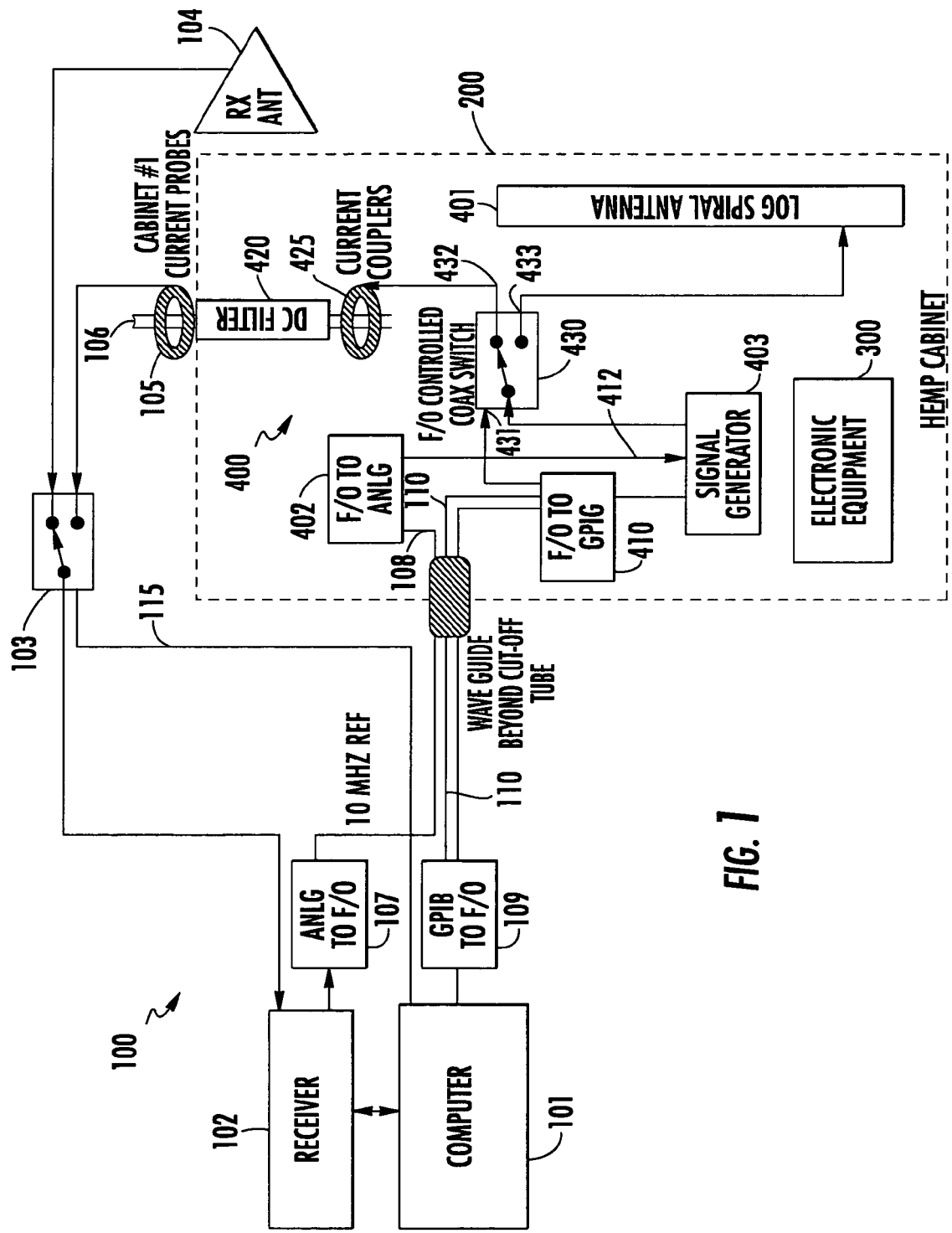
FIG. 1 is an overall block diagram of the electromagnetic protection test and surveillance system in accordance with the present invention.

Before describing the electromagnetic protection test and surveillance system in accordance with the present invention, it should be observed that the invention resides primarily in a modular arrangement of conventional communication electronic circuits and electronic signal processing circuits and components therefor. In a practical implementation that facilitates packaging in a hardware-efficient equipment configuration, these modular arrangements may be readily implemented as field programmable gate array (FPGA)-, or application specific integrated circuit (ASIC)-based chip sets. Consequently, the configuration of such an arrangement of circuits and components and the manner in which they are interfaced with one another have, for the most part, been illustrated in the drawings in readily understandable block diagram format, which show only those specific details that are pertinent to the present invention, so as not to obscure the disclosure with details which will be readily apparent to those skilled in the art having the benefit of the description herein. The block diagram illustrations are primarily intended to show the components of the invention in a convenient functional grouping, whereby the present invention may be more readily understood.

Attention is initially directed to FIG. 1, which is an overall block diagram of the electromagnetic protection test and surveillance system in accordance with the present invention. As shown therein, the present invention includes an external subsystem 100, which is located outside an electromagnetic shielded cabinet 200 containing electronic equipment 300 to be protected, and an internal subsystem 400, which is configured so that it may be readily installed with the shielded electronic equipment within the enclosure 200.

The external subsystem 100 includes a host computer 101, which controls the operation of each of the two subsystems, and a receiver 102, having a relatively narrow IF bandwidth (e.g., on the order of 10 Hz or less to achieve a large measurement dynamic range, and to minimize the effects of ambient RF interference), which is selectively coupled through an input switch 103 to either an RF receive antenna 104 or to a current sense probe 105, under the control of host processor 101 via a control link 115. Receive antenna 104, which may comprise a log periodic antenna, as a non-limiting example, is configured to be pivotally mounted by way of a boom (shown in FIG. 2 to be described), so that its boresight may be selectively directed at the center of a cabinet door-mounted, log-spiral RF transmission antenna 401 for either of first and second spatial locations of the antenna 401 (respectively associated with the open or closed state of a cabinet door). Configuring the RF transmission antenna 401 as a low profile, ferrite-loaded, log-spiral shape facilitates its being unobtrusively supported on the inside of a cabinet door, so as to facilitate space saving and to enable it to be located directly adjacent to the electromagnetic shielding structure of the cabinet. This serves to minimize physical interference with other user equipment, and provides an efficient radiator with constant load impedance over a wide frequency range that is substantially unaffected by conductive surfaces (the door shielding) in close proximity. The current sense probe 105 is coupled to a power link 106, through which power is supplied from an external power supply (not shown) to the circuitry components housed within cabinet 200.

As described briefly above, all (control) communication signals transmitted from the external subsystem 100 to the internal subsystem 400 are conducted by way of fiber optic links; this serves to limit RF emissions by the shielded enclosure, and thereby prevents RF emissions that might interfere with other systems in an equipment bay commonly shared with the equipment 300. To this end an analog-to-fiber optic converter 107 is coupled to convert a 10 MHz analog signal sourced in the receiver 102 into optical format for transport over a fiber optic link 108 to a fiber optic-to-analog converter 402 of the internal subsystem 400. This 10 MHz reference signal is used to synchronize and lock respective receive and transmit oscillators within the receiver 102 and a signal generator 403, so that the two exactly track each other during scanning of the test frequency band, as will be described. The output of fiber optic-to-analog converter 402 is coupled to the signal generator 403 which, under the control of host processor 101, is operative to generate all test signals that are employed to test the effectiveness of the electromagnetic shielding of the cabinet 200, including the RF attenuation of the power filter 420 that is coupled with the power link 106. Having the source of test signals and its associated transmission antenna located within the shielded cabinet serves to minimize the impact of such signals on circuits within the environment outside the cabinet.

The external subsystem 100 further includes a general purpose instrumentation bus (GPIB)-to-fiber optic converter 109, which converts control signals sourced from the host processor 101 into optical format for transport over optical fiber 110 to a fiber optic-to-GPIB converter 410. A first output 411 of the fiber optic-to-GPIB converter 410 is coupled to signal generator 403, while a second output 412 thereof is coupled to the control input 431 of an output switch 430. Output switch 430 has a first output 432, through which RF test signals are coupled to the RF transmission antenna 401, and a second output 433, through which low frequency test signals are coupled to a power lead current coupler 425 on the interior side of power filter 430.

Figure 2:
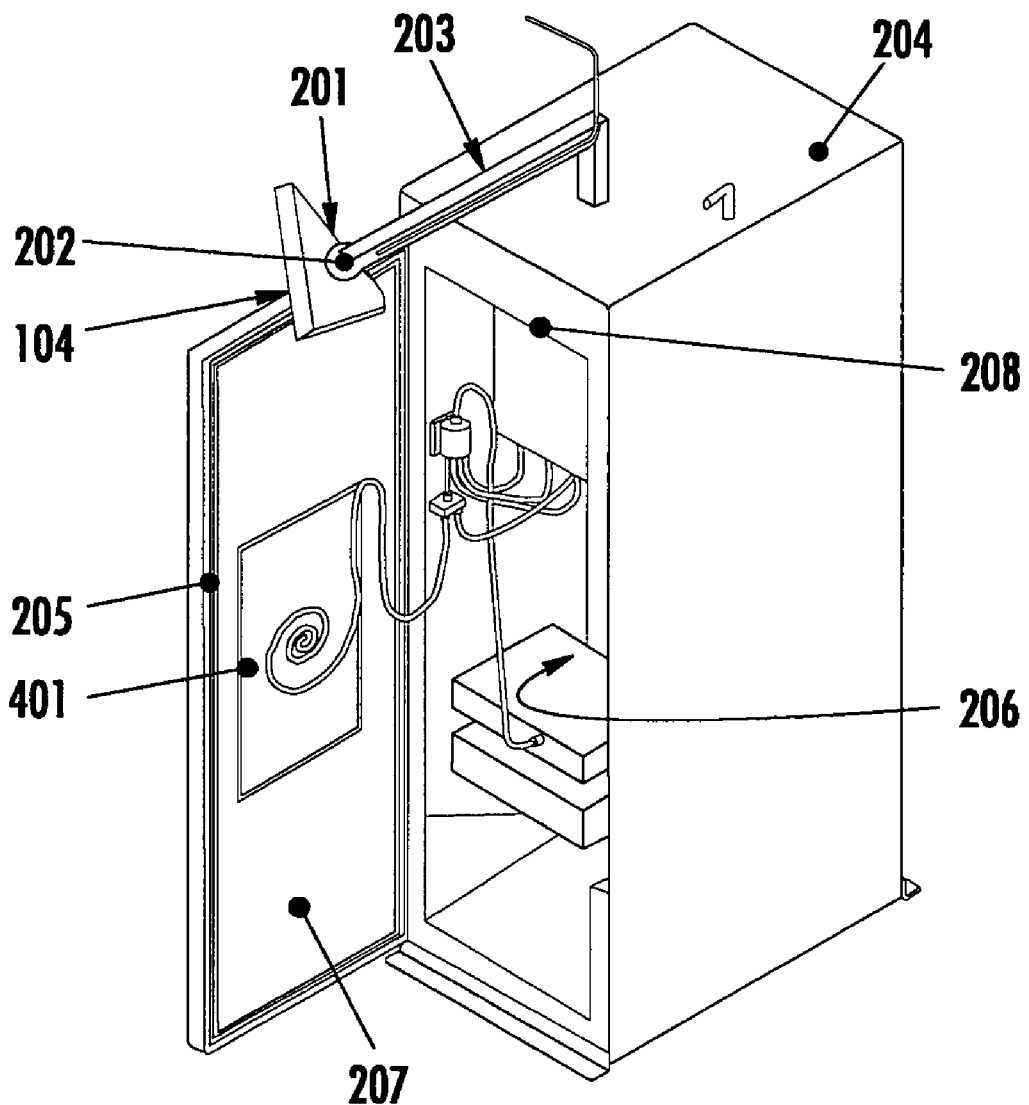
FIG. 2 is a partial respective view of a shielding cabinet that houses and supports portions of the electromagnetic protection test and surveillance system of FIG. 1.

As pointed out above, and as shown in the diagrammatic perspective view of FIG. 2, receive antenna 104 is preferably mounted by way of a pivotable attachment 201 at the distal end 202 of a boom 203, which is supported by and extends outwardly from the top 204 of the cabinet 200. This boom attachment allows the receive antenna 104 to readily clear a cabinet door 205 through which physical access to the interior 206 of the cabinet is provided. In addition, the pivotable attachment 201 of the antenna 104 to the distal end of the boom 203 allows the antenna to be oriented at a selected boresight projection angle relative to the plane of the log-spiral transmission antenna 401.

As a non-limiting example, with the log-spiral RF transmission antenna 401 mounted upon the relatively flat surface of the interior side 207 of the door 205, the boresight axis of RF receive antenna 104 may have a projection angle of 45° relative to the plane of the door 205. This enables the receive antenna 104 to receive both horizontal and vertical polarization components of the RF emissions from RF transmission antenna 401, for either of a first spatial location of antenna 401, corresponding to the open state of the cabinet door 205 shown in FIG. 2, or a second spatial location of antenna 401, corresponding to the closed state of the cabinet door 205.

Namely, for the disposition shown in FIG. 2, the cabinet door 205 is opened such that the plane of the door is generally orthogonal to the side 208 of the cabinet which the door closes. In this position of the door, receive antenna 104 is pivoted to a first antenna position that directs its boresight axis at an angle of 45° relative to the plane of the door and such that the boresight axis of antenna 104 intersects the geometric center of transmission antenna 401. In a complementary manner, when the cabinet door 205 is closed such that the plane of the door is generally parallel to the side 208 of the cabinet, the receive antenna 104 is then pivoted to a second antenna position that again directs the boresight axis of antenna 104 at an angle of 45° relative to the plane of the door and such that the boresight axis of antenna 104 intersects the geometric center of the transmission antenna 401.

To provide its intended shielding, it is common practice to make all the sides of the radiation-blocking enclosure of conductive material (e.g., metal), or to coat each side of the cabinet with a layer of conductive shielding material. In a typical installation, for a rectangular configured cabinet structure, all six sides of the cabinet, including one or more doors thereof, are metallic. As such, the support for the transmission antenna 401 (namely, the door 205) effectively constitutes a ground plane. To compensate for the effect of the ground plane imparted by the metallic material of the door, the printed circuit board upon which the spiral pattern of which the antenna 401 is disposed is preferably back-loaded with ferrite material. This results in transmission antenna 401 having a relatively low standing wave ratio (e.g., on the order of <2.5) across the entirety of its operational frequency band, and remaining unaffected by its relatively close proximity to the metallic surface of its supporting door.

Figure 3:
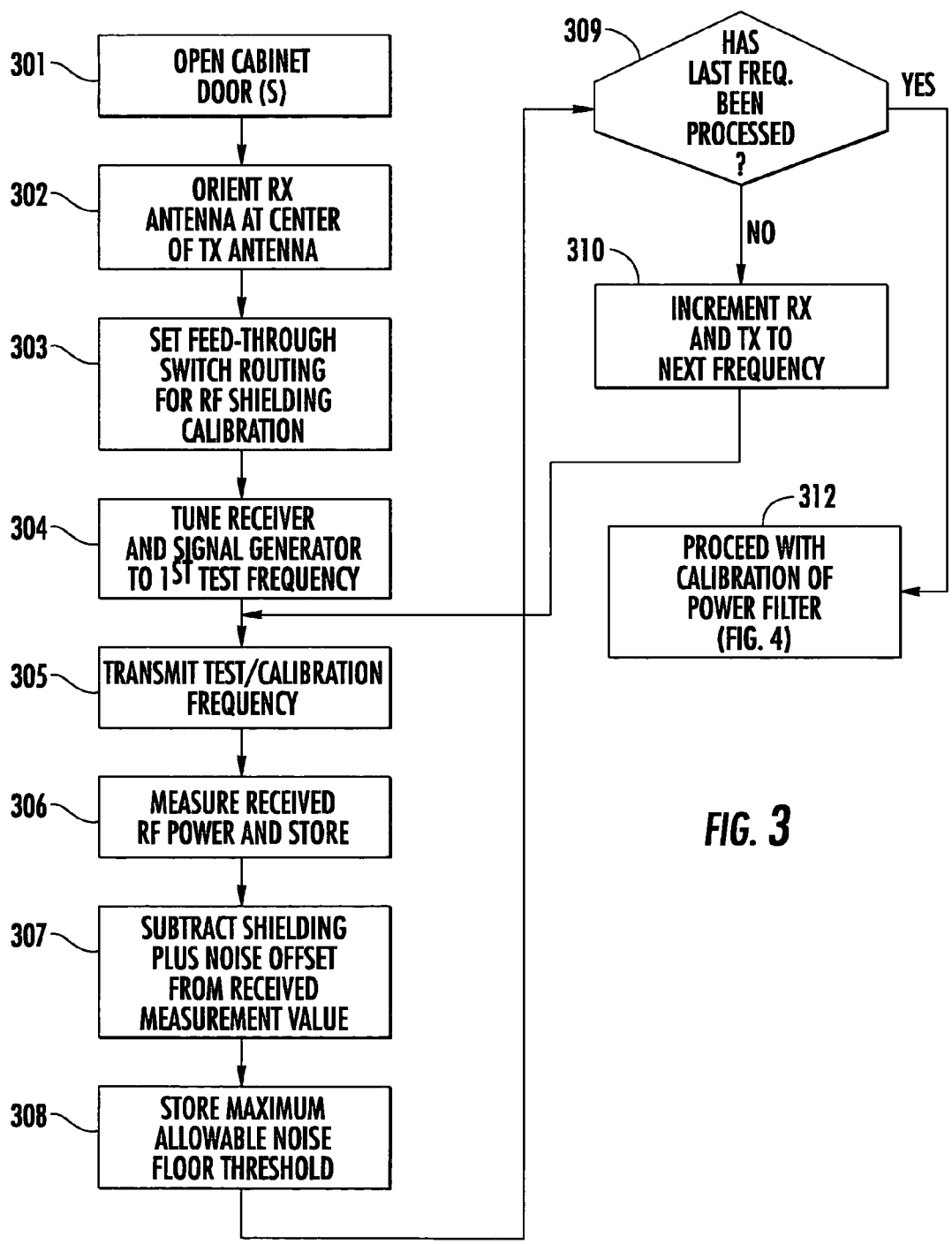
FIGS. 3–6 are flow charts associated with the operation of the electromagnetic protection test and surveillance system of the present invention.

Operation of the electromagnetic protection test and surveillance system shown in FIGS. 1 and 2 may be readily understood by reference to the flow charts of FIGS. 3–6 as follows. Before installing the equipment in the field, it is initially necessary to obtain a baseline relative to which the shielding effectiveness of the cabinet 200 is to be measured. For this purpose, a calibration routine, which is typically conducted in a relatively RF-free environment (e.g., in a factory laboratory) and the steps of which are shown in FIG. 3, is initially conducted.

At a first step 301, the door 205 of the cabinet is opened to its open position shown in FIG. 2. (In the case of a cabinet with more than one door supporting a respective transmit antenna, then there will be more than one receive antenna.) With the cabinet door open, the receive antenna 104 is then oriented at 45° angle relative to its associated door, so that the receive antenna 104 is pointed at the center of the log-spiral transmit antenna 401, as shown in step 302. Next, in step 303, the control processor 101 controls the switches 103 and 430, so that the output of the signal generator 403 will be supplied to antenna 401, and so that the output of the receive antenna 104 will be coupled to receiver 102.

Next, in step 304, the controller tunes the receiver 102 and the signal generator 403 to a first test frequency (e.g., 200 MHz) of a prescribed band of frequencies of interest and, in step 305, instructs the signal generator to transmit at that frequency at a prescribed power level. The power level received by receiver 102 is then stored in memory as the open door calibration value in step 306. In step 307, the control processor subtracts from that stored value a predetermined shielding performance threshold (e.g., 80 dB), plus a signal-to-noise (e.g., 14 dB) buffer value to establish a maximum allowable noise floor that will permit reliable and repeatable measurements, and stores the resulting value in step 308.

Next, in query step 309, the routine determines whether the last frequency (e.g., 1 GHz) in the band of interest has been processed. If the answer is NO, as at the beginning of the calibration process, then in step 310, the routine increments the tuning of the receiver 102 and signal generator 403 to the next frequency subdivision of the band of interest, and branches back to step 305. As pointed out above, during the calibration test, in accordance with a non-limiting example, the band being tested (e.g., 200 Mhz–1 GHz) may be subdivided into respective log-based frequency intervals, at each of which the calibration measurement process described above is carried out.

Once the control processor has conducted the above routine for the last RF frequency (e.g., 1 GHz) in the RF calibration band (the answer to query step 309 is YES), it proceeds to calibrate the effectiveness of the power filter 420. As an alternative the control processor may calibrate the effectiveness of the power filter, prior to conducting the calibration routine for the RF transmitter, without a loss in generality. With reference to the flow chart in FIG. 4, at step 501, with the cabinet door(s) closed, the control processor changes the switch positions of switches 103 and 430, so that the transmit/receive path proceeds from the signal generator 403—the current coupler 425_13 filter 420—current probe 105—receiver 102. Next, similar to the calibration routine for the transmit and receive antennas, described above, in step 502, the signal generator and the receiver are tuned to the same frequency (e.g., 10 KHz) and, in step 503, the attenuation performance of the power filter is measured. The resulting attenuation value is stored in step 504, to provide a baseline against which to measure the attenuation performance of the power filter once the equipment has been installed in the field. In addition, as shown in step 505, an offset (e.g., 6 dB lower than the measured value) may be stored as an alarm threshold for use in the field. Namely, once the equipment has been installed, if the attenuation characteristics of the filter at the performance measurement frequency (10 KHz) are less than the offset (6 dB), the control processor may issue a 'filter failure' indication.

Figure 4:
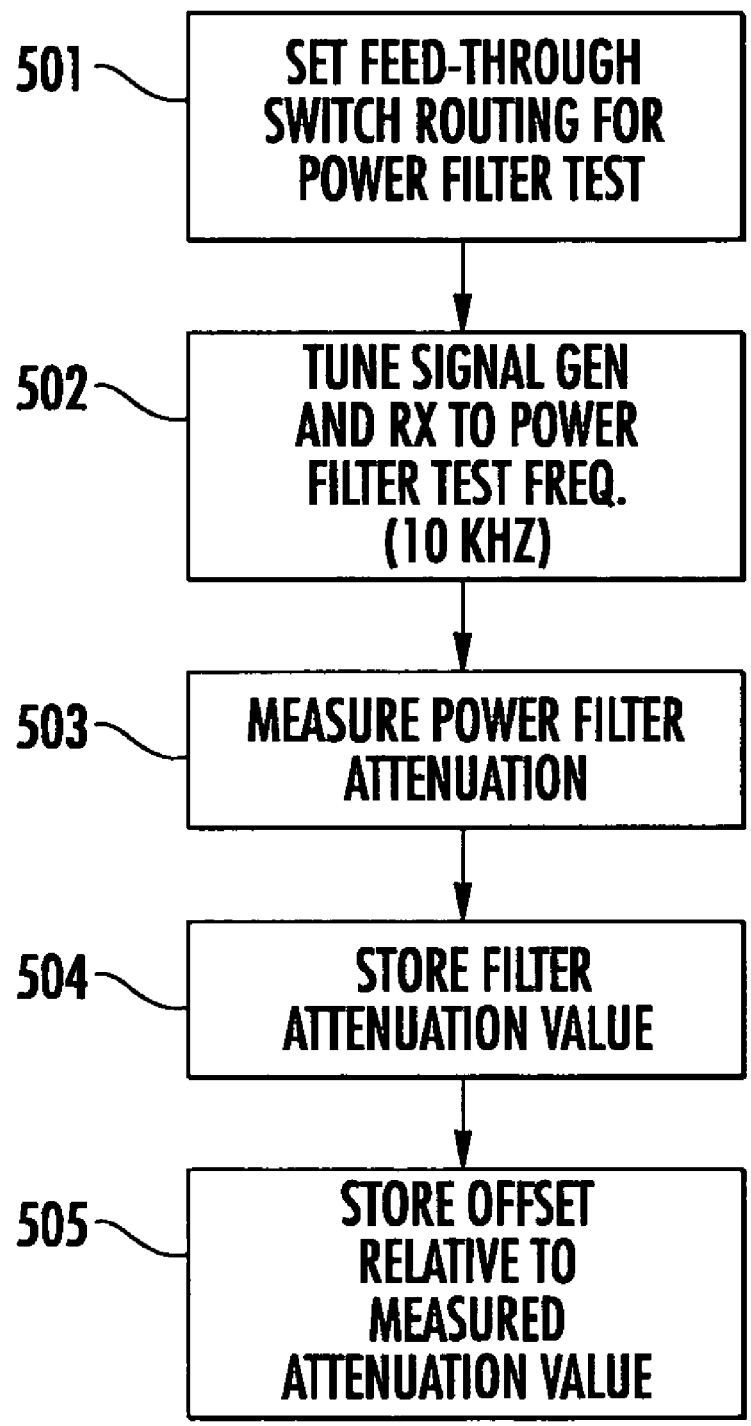
Figure 5:
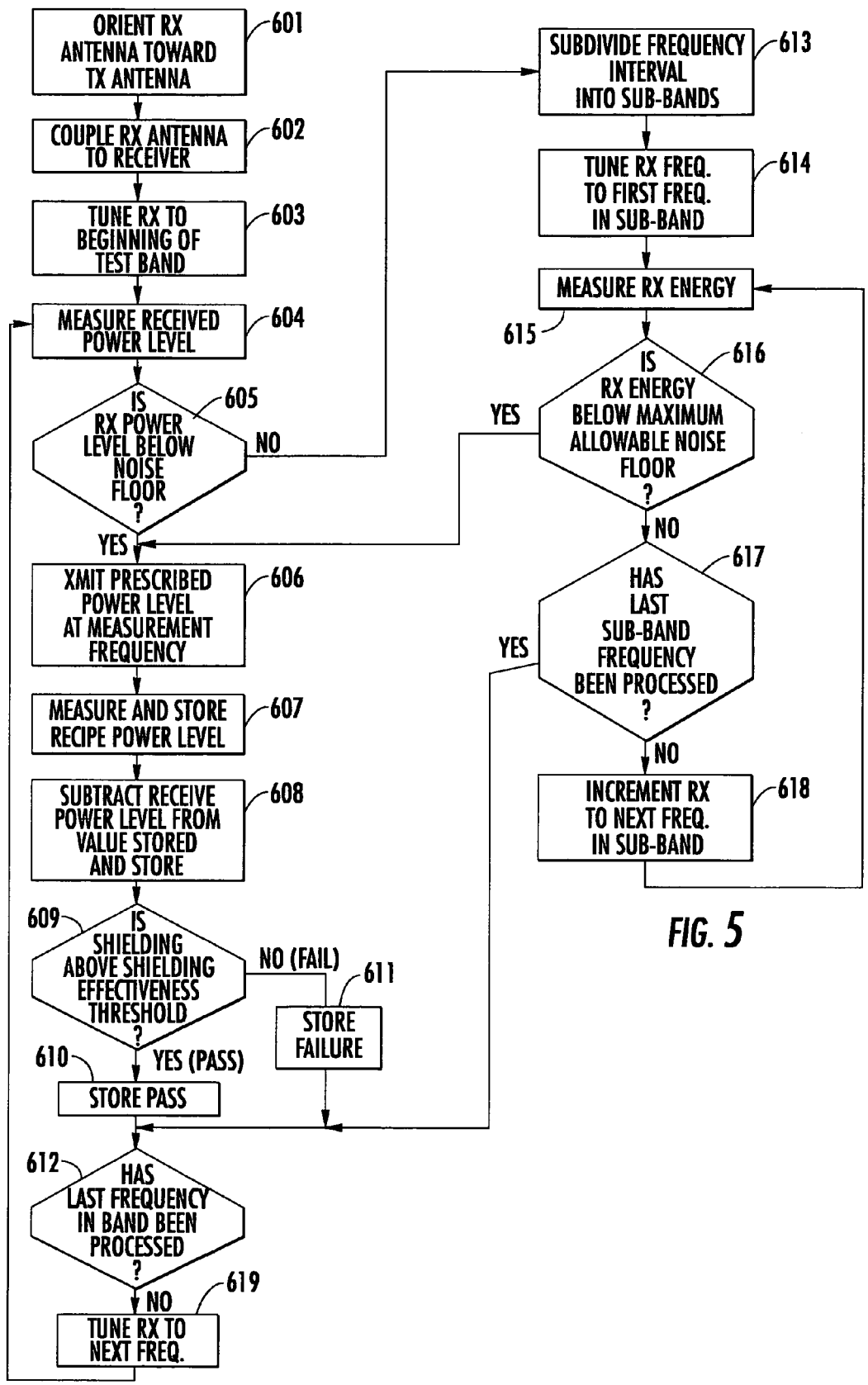
Figure 6:
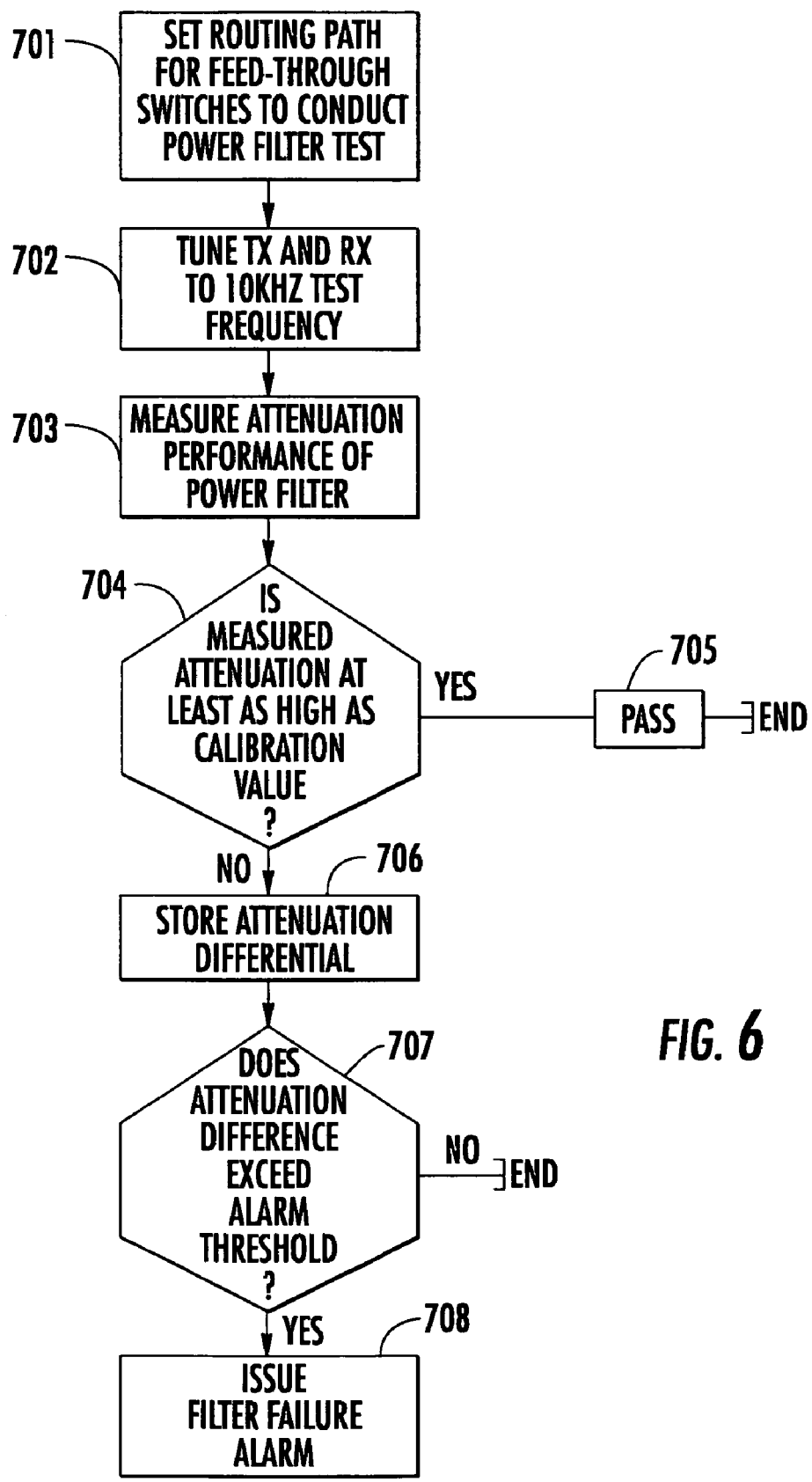

With the calibration routines of FIGS. 3 and 4 completed, the equipment is ready for deployment in the field. Once deployed, a cabinet shielding performance verification test, shown in the flow chart of FIG. 5, is conducted. A precursor aspect of the shielding performance test is to look for the presence of ambient noise (RF interference) sources that might be coincident with one or more of the frequencies of interest and, if such ambient noise sources are found, to locate and identify a nearby (slightly higher) frequency that is effectively free of ambient interference. At each frequency iteration for which it has been determined that a prescribed noise floor is not exceeded, transmitter 403 is caused to generate that frequency and a shielding measurement is performed.

For this purpose, at a first step 601, with the cabinet door closed, the receive antenna 104 is pivoted from its position used in the calibration routine, described above, so that it is oriented at 45° angle relative to the closed door, and so that the receive antenna now points at the center of the transmit antenna 401. Next, in step 602, the control processor 101 controls switch 103, so that the output of the receive antenna 104 will be coupled to receiver 102. Then, in step 603, the controller tunes the receiver 102 to the first test frequency (e.g., 200 MHz) of the prescribed band of frequencies of interest and, in step 604, measures power level received by the receiver 102. In query step 605, this power measurement is compared with the maximum allowable noise floor value, stored at step 308 in the calibration routine of FIG. 3. If the output of the receiver is below the noise floor value for the frequency of interest (the answer to query step 605 is YES), it is inferred that there is not a significant source of interference at this frequency.

The routine then transitions to step 606, wherein the signal generator 403 is caused to generate an output at the same power level used during the calibration routine at the frequency of interest, and the output of receive antenna 104, as received by receiver 102 is measured at this frequency. Next, in step 607, the receive power level is measured and stored. Then, in step 608, the shielding effectiveness of the enclosure is evaluated by subtracting the received power level from the value previously stored in step 306, FIG. 3. Next, in query step 609, the computed shielding level is compared to the predetermined required level (e.g., 80 dB). If the shielding level is equal to or greater than the required level, then a PASS is recorded for that frequency in 610.

On the other hand, if the answer to query step 609 is NO, the effectiveness of the cabinet shielding at that frequency is denoted as a FAIL and stored in 611. Next, in query step 612, the routine determines whether the last frequency (e.g., 1 GHz) in the band of interest (e.g., 200 MHz–1 GHz) has been processed. If the answer to query step 612 is YES, the measurement verification routine is complete. However, if the answer is NO, then in step 619, the routine increments the tuning of the receiver 102 and signal generator 403 to the next frequency subdivision of the band of interest, and branches back to step 604, so as to conduct the verification test for the next frequency within the band of interest.

Where the answer to query step 605 is NO, namely, the output of the receiver 102 is not below the noise floor value for the frequency of interest, it is inferred that there is a source of interference at that frequency. In response, the routine branches to step 613, wherein the band interval between the current frequency, to which the transmitter 403 and receiver 102 are presently tuned, and the next higher frequency of the frequency band of interest, is subdivided into sub-band containing a prescribed plurality (e.g., 100) of frequencies between these two frequencies.

Next, in step 614, the controller tunes the receiver 102 to the first frequency in the sub-band and measures ambient power received by receiver 102 in step 615. In query step 616, this energy measurement is compared with the maximum allowable value for the noise floor. If the output of the receiver is not below the noise floor value for the sub-band of interest (the answer to query step 616 is NO), it is inferred that there is a source of interference at this frequency, so that a shielding effectiveness measurement is not to be carried out at this frequency. Instead, in query step 617, the routine determines whether the last frequency in the sub-band of interest has been processed. If the answer is YES, the routine branches back to step 612 to determine whether the last frequency in the band has been reached, as described above. If the answer is NO, then the routine in step 618 increments the receiver 102 to the next frequency in the sub-band and branches back to step 615 wherein the ambient power received by the receiver is measured, as described above.

Where the output of the receiver is below the noise floor value for the sub-band frequency of interest (the answer to query step 616 is YES), it is inferred that there is not a significant source of interference at this frequency, so that a shielding effectiveness measurement may be carried out at this frequency. In this case, the routine transitions back to step 606. As in the case for query step 609, for either case (PASS or FAIL), the routine branches to step 612, to determine whether the last frequency (e.g., 1 GHz) in the band of interest (e.g., 200 MHz–1 GHz) has been processed. If the answer is NO, then the routine increments the tuning of the receiver 102 and signal generator 403 to the next frequency subdivision of the band of interest, and then branches back to step 604, as described above.

Once the control processor has conducted the RF shielding verification test routine for the last RF frequency (e.g., 1 GHz) in the RF calibration band (the answer to query step 612 is YES), it may proceed to calibrate the effectiveness of the power filter 420. Alternatively, as was the case with the calibration test, the power filter test may be conducted prior to the shielding verification test. The steps of the test are shown in the routine in FIG. 6, and is essentially the same as the calibration test conducted in the lab and shown in FIG. 4, described above. Namely, in step 701, with the cabinet door closed, the control processor changes the switch positions of switches 103 and 430, so that the transmit/receive path proceeds from the signal generator 403—the current coupler 425—filter 420—current probe 105—receiver 102. Next, in step 702, the signal generator and the receiver are then tuned to the same frequency (e.g., 10 KHz) and the attenuation performance of the power filter is measured in step 703. Next, in query step 704 the resulting attenuation value is compared with that previously stored during the calibration test, described above. If the attenuation is at least as high as the calibration value (the answer to query step 704 is YES), it is inferred that the filter is operating properly, and a PASS output is generated in step 705. On the other hand, if the attenuation is not as high as the calibration value (the answer to query step 704 is NO), its difference is noted in step 706. As a further safeguard, shown in query step 707, if the attenuation is less than the alarm threshold offset (e.g., 6 dB) stored in step 505 in the routine of FIG. 3, an alarm may be issued in step 708 as 'filter failure' indication.

As will be appreciated from the foregoing description, the problems of conventional EMP shielding verification test routines (as a non-limiting example) are successfully addressed in accordance with the present invention, which complies with verification requirement (MIL-STD-188-125) that mandates the ability to test the shielding effectiveness of the protective structure subsequent to deployment of the equipment at a host facility, and mitigates installing test components (e.g., placement of a test antenna), once the cabinet has been populated with other equipment. Since the system is controlled by an external processor, which is linked to the internal subsystem by way of fiber optic connections, there is no danger of RF leakage. Having the ferrite-loaded transmit antenna mounted on the inside of a cabinet door provides a considerable saving of internal space of the shielding enclosure, and prevents radiating other equipment within a common equipment bay.

In addition, the use of an extremely narrow receive bandwidth serves to minimize effects of interference from surrounding equipment at the same facility and other RF environments, while also achieving an ultra low noise floor to minimize the required signal source power within the cabinet to a level that is significantly below the Network Equipment Building System (NEBS) rated RF susceptibility level. Also, the use of a slaved clock reference for synchronization between the signal generator and the receiver effectively eliminates the need for frequency precision and peak search measurement delays.

While we have shown and described an embodiment in accordance with the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed is:

1. A method of testing the RF-shielding effectiveness of an RF-shielding enclosure for electronic equipment enclosed therein comprising the steps of:
   (a) deploying said RF-shielding enclosure containing said electronic equipment to an installation field site containing other electronic equipment;
   (b) transmitting RF energy from an RF transmitter enclosed within said RF-shielding enclosure;
   (c) measuring RF energy received at an RF receiver external to said RF-shielding enclosure;
   (d) providing an indication of the effectiveness of said RF shielding to block the transmission therethrough of said RF energy transmitted by said enclosed RF transmitter;
   (e) coupling power through a power line containing a power supply filter to said electronic equipment installed within said RF-shielding enclosure;
   (f) coupling RF energy from said RF transmitter enclosed within said RF-shielding enclosure to a location of said power line inside said enclosure;
   (g) coupling said RF receiver to a location of said power line outside said enclosure;
   (h) measuring RF energy coupled to said power line by said RF transmitter in step (f) and received by said RF receiver; and
   (i) providing an indication of the effectiveness of said power supply filter to block the transmission therethrough of said RF energy coupled to said power line in step (f).

2. The method according to claim 1, wherein step (b) comprises transmitting RF energy from said RF transmitter by way of a generally flat RF antenna mounted at the interior side of a door of said enclosure.

3. A method of testing the RF-shielding effectiveness of an RF-shielding enclosure for electronic equipment enclosed therein comprising the steps of:
   (a) deploying said RF-shielding enclosure containing said electronic equipment to an installation field site containing other electronic equipment;
   (b) transmitting RF energy from an RF transmitter enclosed within said RF-shielding enclosure;
   (c) measuring RF energy received at an RF receiver external to said RF-shielding enclosure; and
   (d) providing an indication of the effectiveness of said RF shielding to block the transmission therethrough of said RF energy transmitted by said enclosed RF transmitter; and wherein
   step (b) comprises transmitting RF energy from said RF transmitter by way of a generally flat RF antenna mounted at the interior side of a door of said enclosure; and
   wherein step (c) comprises receiving RF energy transmitted from said RF transmitter at a RF receiving antenna external to said RF-shielding enclosure, and being configured to have its boresight axis pointable to a prescribed location of said generally flat RF antenna for each of an open and a closed condition of said door.

4. The method according to claim 3, wherein said generally flat RF antenna comprises a ferrite-loaded log spiral antenna, and said RF receiving antenna comprises a pivotable log periodic antenna.

5. A method of testing the RF-shielding effectiveness of an RF-shielding enclosure for electronic equipment enclosed therein comprising the steps of:
   i—calibrating the RF-shielding effectiveness of said RF-shielding enclosure by:
   (a) mounting RF a generally flat transmission antenna on an interior side of a door of said RF-shielding enclosure;
   (b) mounting an RF receive antenna external to said RF-shielding enclosure;
   (c) prior to deploying said RP-shielding enclosure containing said electronic equipment to an installation field site containing other electronic equipment, opening said door of said enclosure and transmitting RF energy from said RF transmission antenna mounted thereon;
   (d) measuring RF energy received at an RF antenna outside said RF-shielding enclosure and pointed at said RF transmission antenna as mounted on said open door; and
   (e) generating a baseline attenuation measurement relative to RF energy received in step (d); and
   ii—verifying the RF-shielding effectiveness of said RF-shielding enclosure as calibrated in step i by:
   (f) deploying said RF-shielding enclosure containing said electronic equipment to an installation field site containing other electronic equipment, closing said door of said enclosure and transmitting RF energy from said RF transmission antenna mounted thereon;
   (g) measuring RF energy received at an RF antenna outside said RF-shielding enclosure and pointed at said RF transmission antenna as mounted on said closed door;
   (h) providing an indication of the effectiveness of said RF shielding to block the transmission of RF energy therethrough, in accordance with a prescribed relationship between said RF energy measured in step (g) and said baseline attenuation measurement generated in step (e).

6. The method according to claim 5, wherein step (f) includes the steps of:
(f1) deploying said RF-shielding enclosure containing said electronic equipment to an installation field site containing other electronic equipment, and closing said door of said enclosure;
(f2) measuring RF energy at a first prescribed frequency received at said RF antenna outside said RF-shielding enclosure and pointed at said RF transmission antenna as mounted on said closed door without transmitting RF energy from said RF transmission antenna within said enclosure;
(f3) in response to RP energy measured in step (f2) having a prescribed relationship relative to said baseline attenuation measurement generated in step (e), transmitting RF energy from said RF transmission antenna at said first prescribed frequency, but otherwise not transmitting at said first prescribed frequency.

7. The method according to claim 6, wherein step (f2) further includes,
in response to RF energy measured at said first prescribed frequency not having said prescribed relationship relative to said baseline attenuation measurement generated in step (e), measuring RF energy at a second prescribed frequency received at said RF antenna without transmitting RF energy from said RF transmission antenna within said enclosure, and
step (f3) comprises,
in response to RF energy at said second prescribed frequency measured in step (f2) having a prescribed relationship relative to said baseline attenuation measurement generated in step (e), transmitting RF energy from said RF transmission antenna at said second prescribed frequency, but otherwise not transmitting at said second prescribed frequency.

8. The method according to claim 5, wherein said RF transmission antenna comprises a ferrite-loaded log spiral antenna, and said RF receiving antenna comprises a pivotable log periodic antenna.

9. A method of testing the RF-shielding effectiveness of an RF-shielding enclosure for electronic equipment enclosed therein comprising the steps of:
(a) deploying said RF-shielding enclosure containing said electronic equipment and an RF transmitter and associated RF transmission antenna to an installation field site containing other electronic equipment;
(b) for a closed condition of said enclosure and without transmitting RF energy from said RF transmitter, measuring ambient RF energy over a prescribed band of frequencies at an RF receive antenna external to said enclosure;
(c) in response to ambient RF energy measured in step (b) being less than a predetermined baseline at an RF frequency within said prescribed band of RF frequencies, causing said RF transmitter to transmit RF energy at said RF frequency;
(d) measuring RF energy at said RF frequency received at said RF receive antenna; and
(e) providing an indication of the effectiveness of said RF shielding to block the transmission therethrough of said RF energy at said RF frequency as transmitted in step (c) and measured in step (d);
wherein step (c) comprises transmitting RF energy from said RF transmitter by way of a generally flat RF antenna mounted at the interior side of a door of said enclosure.

10. The method according to claim 9, wherein step (c) further comprises, in response to ambient RF energy measured in step (b) not being less than said predetermined baseline at said RF frequency within said prescribed band of RF frequencies, causing said RF transmitter to transmit RF energy at another RF frequency; and wherein step (d) comprises measuring RF energy at said another RF frequency received at said RF receive antenna; and step (e) comprises providing an indication of the effectiveness of said RF shielding to block the transmission therethrough of said RF energy at said another RF frequency as transmitted in step (c) and measured in step (d).

11. The method according to claim 10, wherein step (d) comprises receiving RF energy transmitted from said RF transmitter at a RF receiving antenna external to said RF-shielding enclosure, and being configured have its boresight axis pointable to a prescribed location of said generally flat RP antenna for each of an open and a closed condition of said door.

12. The method according to claim 11, wherein said generally flat RF antenna comprises a ferrite-loaded log spiral antenna, and said RF receiving antenna comprises a pivotable log periodic antenna.

13. A system for testing the RF-shielding effectiveness of an RF-shielding enclosure for electronic equipment enclosed therein, when said RF-shielding enclosure and said electronic equipment enclosed therein being deployed to an installation field site containing other electronic equipment, said system comprising:
an RF transmitter enclosed within said RF-shielding enclosure, and being operative to transmit RF energy from an RF transmit antenna internal to said RF-shielding enclosure wherein said RF transmit antenna a generally flat RF transmit antenna mounted at an interior side of a door of said enclosure;
an RF receive antenna external to said RF-shielding enclosure and coupled to an RF receiver which is operative to measure RF energy as received by said RF receive antenna;
a control processor which is coupled to said RF transmitter and said RF receiver and is operative to derive an indication of the effectiveness of said RF shielding to block the transmission therethrough of RF energy transmitted by said RF-transmitter; and
a power supply filter coupled a power line for said electronic equipment installed within said RF-shielding enclosure, and wherein said RF transmitter is operative to couple RF energy to a location of said power line inside said RF-shielding enclosure, and said RF receiver is controllably coupled to a location of said power line outside said enclosure, and is operative to measure RF energy as coupled to said power line by said RF transmitter and filtered by said power supply filter, and wherein said control processor is operative to provide an indication of the effectiveness of said power supply filter to block the transmission therethrough of said RF energy coupled to said power line by said RF transmitter.

14. The system according to claim 13, wherein said RF receive antenna is configured to have its boresight axis pointable to a prescribed location of said generally flat RF antenna for each of an open and a closed condition of said door.

15. The system according to claim 14, wherein said generally flat RF antenna comprises a ferrite-loaded log spiral antenna, and said RF receive antenna comprises a pivotable log periodic antenna, that is configured to be pointed at 45° relative to said generally flat RF antenna so as to be capable of receiving both vertical and horizontal polarized components of RF transmissions from said generally flat RF antenna.

16. The system according to claim 13, wherein said RF receiver comprises a narrow bandwidth RF receiver, and said RF transmitter and said RF receiver are synchronized to a common clock.

17. The system according to claim 13, wherein said control processor is coupled to said RF transmitter within said RF-shielding enclosure by way of a fiber-optic communication path.

18. A system for testing the RF-shielding effectiveness of an RF-shielding enclosure for electronic equipment enclosed therein, when said RF-shielding enclosure and said electronic equipment enclosed therein being deployed to an installation field site containing other electronic equipment, said system comprising:

an RF transmitter enclosed within said RF-shielding enclosure, and being operative to transmit RF energy from an RF transmit antenna internal to said RF-shielding enclosure wherein said RF transmit antenna a generally flat RF transmit antenna mounted at an interior side of a door of said enclosure;

an RF receive antenna external to said RF-shielding enclosure and coupled to an RF receiver which is operative to measure RF energy as received by said RF receive antenna; and a control processor which is coupled to said RF transmitter and said RF receiver and is operative to derive an indication of the effectiveness of said RF shielding to block the transmission therethrough of RF energy transmitted by said RF transmitter; and wherein said control processor is operative, for a closed condition of said enclosure and without transmitting RF energy from said RF transmitter, to measure ambient RF energy over a prescribed band of frequencies at an RF receive antenna and, in response to measuring ambient RF energy being less than a predetermined baseline at an RF frequency within said prescribed band of RF frequencies, to cause said RF transmitter to transmit RF energy at said RF frequency.

19. The system according to claim 18, wherein said control processor is further operative to measure RF energy at said RF frequency received at said RF receive antenna, and to provide an indication of the effectiveness of said RF shielding to block the transmission therethrough of said RF energy at said RF frequency.

* * * * *